United States Patent [19]

Shannon et al.

[11] Patent Number: 4,516,146

[45] Date of Patent: May 7, 1985

[54] ELECTRON SOURCES AND EQUIPMENT HAVING ELECTRON SOURCES

[75] Inventors: John M. Shannon, Whyteleafe, England; Arthur M. E. Hoeberechts; Gerardus G. P. Van Gorkom, both of Eindhoven, Netherlands

[73] Assignee: U.S. Philips Corporation, New York, N.Y.

[21] Appl. No.: 439,144

[22] Filed: Nov. 4, 1982

[30] Foreign Application Priority Data

Nov. 6, 1981 [GB] United Kingdom ................. 8133501

[51] Int. Cl.[3] .............................................. H01L 29/34

[52] U.S. Cl. ........................................ 357/52; 357/13; 357/4; 357/88; 357/90

[58] Field of Search ..................... 357/13, 52, 4, 88, 90

[56] References Cited

U.S. PATENT DOCUMENTS

| | | | |
|---|---|---|---|
| 2,960,659 | 11/1960 | Burton | 357/13 |
| 3,931,633 | 1/1976 | Shannon | 357/13 |
| 4,000,503 | 12/1976 | Matare | 357/52 |
| 4,015,284 | 3/1977 | Hara | 357/52 |
| 4,259,678 | 3/1981 | Van Gorkom | 357/13 |
| 4,303,930 | 12/1981 | Van Gorkom | 357/13 |
| 4,352,117 | 9/1982 | Cuomo | 357/52 |

*Primary Examiner*—Martin H. Edlow
*Attorney, Agent, or Firm*—Robert T. Mayer; Steven R. Biren

[57] ABSTRACT

An electron source having a rapid response time comprises at least one n-p-n structure (and possibly an array of said n-p-n structure) formed in a silicon or other semiconductor body (10) by a p-type first region (1) between n-type second and third regions (2 and 3). Electrons (24) are generated in the n-p-n structure (2,1,3) for emission into free space (20) from a surface area (4) of the body (10) after flowing from the second region (2) through the first and third regions (1 and 3). The n-p-n structure (2,1,3) has electrode connections (12 and 13) only to the n-type second and third regions (2 and 3). The first region (1) provides a barrier region restricting the flow of electrons from the second region (2) to the third region (3) until a potential difference (V) is applied between the electrode connections (12 and 13) to bias the third region (3) positive with respect to the second region (2) and to establish a supply of hot electrons (24) injected into the third region (3) with sufficient energy to overcome the potential barrier present between the surface area (4) and free space (20). The barrier region (1) forms depletion layers with both the n-type second and third regions (2 and b 3) and is depleted of holes by the merging together of these depletion layers at least when the potential difference (V) is applied to establish said supply of hot electrons (24). The n-p-n structure can be provided in a mesa portion (9) of the body (10) at a window in an insulating layer (11) so as to form a compact arrangement having very low associated capacitances. The electron sources may be used in cathode-ray tubes, display devices and even electron lithography equipment.

10 Claims, 6 Drawing Figures

ELECTRON SOURCES AND EQUIPMENT HAVING ELECTRON SOURCES

BACKGROUND OF THE INVENTION

This invention relates to an electron source for emitting a flow of electrons, particularly but not exclusively a fast response electron source for cathode ray tubes, image pick-up devices, display devices or electron lithography. The invention further relates to equipment having such electron sources.

U.K. Patent Specification (GB-A) No. 830,086 discloses an electron source comprising a semiconductor body, and an n-p-n structure formed in the body by a p-type first region between n-type second and third regions. Electrons are generated in said n-p-n structure for emission into free space from a surface area of said body after flowing from the second region through the first and third regions. An advantage of this n-p-n structure (a specific example of which is illustrated in FIG. 3 of GB-A No. 830,086) is that the electron source can operate with voltage levels below those necessary to cause avalanche breakdown of the semiconductor. Examples of other electron sources which have a simple p-n structure but which are operated in avalanche breakdown are also described in GB-A No. 830,086.

Each region of the n-p-n structure disclosed in GB-A No. 830,086 has an electrode connected to a voltage supply for operating the structure in a manner similar to a transistor. The first p-n junction which is between the second and first regions is biased in the forward direction like an emitter junction. The second p-n junction between the p-type first region and the n-type third region is biased in the reverse direction like a collector junction. Only a small saturation current flows across the second p-n junction in the absence of any injection of electrons from the first p-n junction. The electrons injected into the p-region diffuse across the p-region and are accelerated to high energies by the potential drop across the second p-n junction. By having a very thin n-type third region coated with a material reducing the electron work function, some of these electrons escape into free space before losing their energy to the lattice. The amount of such electron emission into free space is adjusted by varying the voltage of the voltage supply applied across the first p-n junction between the second and first regions.

However such an n-p-n electron source as disclosed in GB-A No. 830,086 has several disadvantages. The electrons injected into the p-type region and the holes injected into the n-type second region constitute minority charge-carriers which lead to charge-storage time delays in the switching rate of the device, similar to those occurring with n-p-n bipolar transistors. This limits the rate at which the electron source can be switched to vary the electron flux emitted by the device.

In practice only a small proportion of the accelerated electrons emerges from the surface area (in spite of the coating on the thin third region). The much larger proportion of electrons which are not emitted are extracted from the device as a current flow from the electrode connection of the third region. It is desirable to have a very thin third region in order to maximize the number of electrons emerging from the surface area. A thickness range of 0.01 to 10 micrometers is mentioned in GB No. 830,086. However in order to act as a n-p-n transistor structure with base control of the collector current, the n-type third region of the device described in GB No. 830,086 cannot be very highly doped compared with the first and second regions without degradation of the transistor emitter efficiency. Therefore, in practice if its thickness is significantly less than about 1 micrometer, the third region will have a high electrical resistance. Thus, the rate at which the electron source can be switched will be further limited by the R.C. time constant resulting from this high collector resistance and associated junction capacitance. Furthermore because the n-type second region needs to be highly doped for good transistor emitter efficiency its p-n junction with the p-type first region will have a large capacitance which must be charged via the base resistance of the transistor structure so further limiting the response rate of the electron source.

The electrode connections to each region of the n-p-n structure are indispensable to the operation of the device disclosed in GB No. 830,086. This requirement for three separate electrode connections complicates the structure of the electron source and its manufacture in a reliable manner, particularly if it is desired to fabricate a two-dimensional array of such devices in a common semiconductor body. Such two-dimensional arrays are desirable for image pick-up devices, display devices and electron lithography. Furthermore in order to provide the intermediate p-type region with a sufficient contact area for its electrode connection, it is generally necessary to extend the p-type region over a surface area alongside the n-type third region, but this increases the p-n junction area and associated capacitance and therefore tends further to reduce the response speed of the electron source.

SUMMARY OF THE INVENTION

According to a first aspect of the present invention an electron source for emitting a flow of electrons, comprising a semiconductor body, an n-p-n structure formed in the body by a p-type first region between n-type second and third regions, electrons being generated in said n-p-n structure for emission from a surface area of said body after flowing from the second region through the first and third regions, is characterized in that the n-p-n structure has electrode connections only to said n-type second and third regions, in that the first region provides a barrier region restricting the flow of electrons from the second region to the third region until a potential difference is applied between said electrode connections to bias the third region positive with respect to the second region and to establish a supply of hot electrons injected into said third region with sufficient energy to overcome the surface barrier at said surface area of the body, said barrier region forming depletion layers with both the n-type second and third regions and having such a thickness and doping concentration as to be depleted of holes by the merging together of said depletion layers in the barrier region at least when said potential difference is applied between said electrode connections to establish said supply of hot electrons.

Such a device structure in accordance with the invention is of simple construction and permits obtaining an electron source which can have a high response rate, thus permitting rapid variation of the emitted electron flux and which can be fabricated readily as an array of such electron sources in a common semiconductor body.

Because the p-type first region is depleted of holes by the merging of the depletion layers at least when the supply of hot electrons is established, the electron source acts as a unipolar majority carrier device at least when operated around these voltage levels, thus avoiding delays due to storage of minority charge carriers. Because the depleted first region behaves as a negative space-charge barrier region between the n-type second and third regions (instead of acting as a bipolar transistor base region), the n-type third region can have a higher conductivity-type determining doping concentration than that of the p-type first region and that of at least the part of the n-type second region adjacent the first region. This third region may be very highly doped, for example at least $10^{19}$ dopant atoms per $cm^3$ or even degenerately doped, so that its electrical resistance can be very low. This is important for extracting the current of electrons which are injected into the third region but which are not emitted from the surface area. The very high doping of the third region is also important in permitting the distance between the surface area and the point of emission of the hot electrons into the third region to be kept to a minimum so as to maximize the efficiency of the electron source. By comparison, the n-type second region can be lightly doped to minimize the capacitance of the junction between the first and second regions. The absence of any electrode connection to the intermediate first region also permits arrangement of the first, second and third regions in a simple sandwich structure with low associated capacitances, thus further improving the response rate of the electron source.

A particularly compact, reliable and low-capacitance structure results when an apertured insulating layer is sunk over at least part of its thickness in the body to form at least one mesa portion of the body bounded laterally by the sunken insulating layer, and at least the first and third regions are formed within the mesa portion and are bounded around their edges by the sunken insulating layer. Such mesa portion structures can also be fabricated side-by-side in a common semiconductor body so as to provide an advantageous 2-dimensional array electron source having a particularly simple interconnection arrangement, as will be described hereinafter.

Furthermore the potential barrier formed between the n-type second and third regions can be adjusted by appropriately choosing the doping concentration and thickness of the intermediate first region so that the hot electrons are injected into the third region at just the right energy to cross to the surface area and to overcome the surface barrier at that area. Thus, efficient electron emission can be achieved with an applied potential difference which is not significantly greater than the minimum necessary for overcoming the surface barrier so that the electrical power loss with the electron source can be kept to a minimum. For the same purpose it is generally desirable to reduce the surface barrier, for example by coating the surface area where the electrons are emitted with a material reducing the electron work function.

According to a second aspect of the present invention there is provided equipment comprising a vacuum envelope within which a vacuum can be maintained, and an electron source in accordance with the first aspect of the invention, said electron source being mounted within the envelope for emitting electrons into said vacuum during operation of the equipment. Such equipment may be, for example, a cathode-ray tube, an image pick-up device, a display device, or electron lithography equipment for the manufacture of microminiature solid-state devices.

BRIEF DESCRIPTION OF THE DRAWING

These and other features in accordance with the present invention will now be described with reference to the accompanying diagrammatic drawings illustrating by way of example, various embodiments of the invention. In these drawings.

Figure 1:
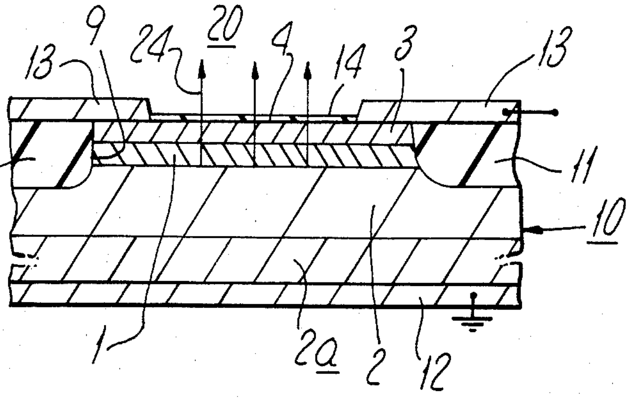
FIG. 1 is a cross-sectional view of part of a semiconductor body of an electron source in accordance with the invention.

It should be noted that all the Figures are diagrammatic and not drawn to scale. The relative dimensions and proportions of some parts of these Figures have been shown greatly exaggerated or reduced for the sake of convenience and clarity in the drawing. The same reference numerals as used in one embodiment are generally used to refer to corresponding or similar parts in the other embodiments.

DESCRIPTION OF THE PREFERRED EMBODIMENTS

The electron source illustrated in FIG. 1 comprises a monocrystalline silicon semiconductor body 10 in which a n-p-n structure is formed by a p-type first region 1 between n-type second and third regions 2 and 3. Electrons 24 are generated in this n-p-n structure for emission into free space 20 from a surface area 4 of the body 10 after flowing from the second region 2 through the first and third regions 1 and 3, as represented by arrows 24 in FIG. 1.

In accordance with the present invention the n-p-n structure 2-1-3 has electrode connections only to the n-type second and third regions 2 and 3. These electrode connections may be formed by metal layers 12 and 13 forming ohmic contacts to the regions 2 and 3 respectively. There is no electrode connection to the p-type intermediate region 1 which provides a barrier region restricting the flow of electrons 24 from the region 2 to the region 3 until a potential difference V is applied between the electrode connections 12 and 13 to bias the region 3 positive with respect to the second region and to establish a supply of hot electrons 24 injected into the region 3 with sufficient energy to overcome the potential barrier present between the surface area 4 and free space 20. The barrier region 1 forms depletion layers with both the n-type regions 2 and 3 and has such a thickness and doping concentration as to be depleted of holes by the merging together of the depletion layers in the region 1 at least when the potential difference V is applied to establish the supply of hot electrons 24.

As illustrated in FIG. 1 an apertured insulating layer 11 is sunk over at least part of its thickness in the body 10 to form at least one mesa portion 9 of the body 10 bounded laterally by the sunken insulating layer 11. The regions 1 and 3 are formed within the mesa portion 9 and are bounded around their edges by the insulating layer 11. This results in a very compact, low-capacitance structure in which the electrode connection 13 can be provided in a reliable manner at the top surface of the mesa portion 9 without contacting the p-type region 1. Furthermore, the metal layer forming the electrode connection 13 can extend onto and across the insulating layer 11 to provide an extended contact area to which external connections (for example in the form of wires) can be bonded. The top surface of the mesa portion 9 provides the surface area 4 from which the electrons 24 are emitted. If the metal layer 13 is sufficiently thin it may extend over the surface area 4. However, preferably the layer 13 is thicker and contacts the region 3 at the edge of the mesa portion 9 as illustrated in FIG. 1.

In the electron source of FIG. 1 the region 2 can be formed by a high resistivity n-type epitaxial layer (n−) on a low resistivity n-type substrate *2a*. The substrate *2a* provides a low resistance connection to the metal layer 12 which can extend over the whole back surface of the substrate *2a*. Such a substrate arrangement is particularly suitable for a device having only a single electron source in the body 10. However, it may also be used for devices having a plurality of these electron sources in a common body 10 with a common region 2 and common electrode connection 12 but with separate individual electrode connections 13 for the individual electron sources having individual regions 1 and 3.

The manufacture of a particular example of the electron source structure of FIG. 1 will now be described. A phosphorus-doped silicon layer having a resistivity of, for example, 5 ohm-cm (approximately $10^{15}$ phosphorus atoms/cm$^3$) and a thickness of, for example, 5 micrometers is epitaxially grown in known manner on a phosphorus-doped silicon substrate *2a* having a resistivity of, for example, 0.05 ohm-cm and a thickness of, for example, 240 micrometers. The insulating layer 11 can be formed locally in the major surface of the epitaxial layer using known thermal oxidation techniques to a sufficient depth, for example 0.1 micrometer or more below the silicon surface. The particular depth chosen is determined by the height of the mesa portion 9 needed to accommodate reliably regions 1 and 3 of particular thicknesses. The regions 1 and 3 can then be formed in the mesa portion 9 by ion implantation. Boron ions in a dose of, for example, $2\times10^{14}$ cm$^{-2}$ and at an energy of, for example, 4.5 keV may be used to form the region 1, while arsenic ions in a dose of, for example, $5\times10^{14}$ cm$^{-2}$ and at an energy of 10 keV may form the n-type region 3. After annealing the implants, the metal layers 13 and 12 which may be of aluminum are provided to form the electrode connections. In this way an electron source having a response time of about 5 nanoseconds or even less can be obtained, permitting rapid modulation of the emitted electron flux by switching the applied voltage V around a level of about 4 volts. This very high operational speed results because the region 1 is depleted of holes when the supply of hot electrons 24 is established, the n-p-n structure in the mesa portion 9 has very low associated capacitances, and the n-type region 3 has a high doping concentration.

The active doping concentration and thickness finally obtained for the n-type region 3 depend on the particular ion species, energy and dose used and on the annealing conditions. A region 3 having an estimated thickness of 0.025 micrometer and an estimated active doping concentration of $5\times10^{20}$ cm$^{-3}$ can be formed by annealing said implant of $5\times10^{14}$ cm$^{-2}$ 10 keV arsenic ions at 700° C. in vacuo. By having such a small thickness for the region 3, energy loss for the electrons 24 in the region 3 is kept low so enhancing the likelihood for emission of the electrons from the surface area 4. Those electrons which are not emitted from the surface area 4 area extracted via the electrode connection 13. By having such a high doping concentration in spite of its small thickness, the n-type region 3 exhibits an electrical resistance which is sufficiently low for rapid modulation of the emitted electron flux.

The active doping concentration and thickness of the barrier region 1 similarly depends on the particular ion species, energy, dose and annealing conditions and can be chosen to determine the desired height of the potential barrier for electrons between regions 2 and 3 and to determine whether the region 1 is depleted of holes only when a potential difference V of at least a predetermined minimum magnitude is applied. By annealing said implant of $2\times10^{14}$ cm$^{-2}$ 4.5 keV boron ions at 700° C. in vacuo, the resulting barrier region 1 can have an estimated thickness of about 0.05 micrometer and an estimated active doping concentration of about $2\times10^{18}$ cm$^{-3}$ which result in a potential barrier of about 4 volts to electron flow from region 2 to region 3. The resulting barrier region 1 is also undepleted of holes over a part of its thickness by the depletion layers formed with the n-type regions 2 and 3 at zero bias. The application of a potential difference V of at least a predetermined minimum magnitude is necessary to spread these depletion layers across the whole thickness of the region 1. The magnitude of the potential difference V needed to wholly deplete the region 1 by so-called "punch through" of its depletion layers in this manner is determined by the doping concentration and thickness of the region 1. Until the region 1 is fully depleted, the undepleted part of the region 1 inhibits injection of hot electrons 24 into the region 3 and the effect of the applied bias voltage is to increase, relative to the surface barrier, the energy of the electron distribution to be injected. In this way when injection occurs the energy of the injected electrons 24 can be significantly higher than the surface barrier thus permitting a high emission efficiency from the surface area 4. This situation is illustrated in FIG. 2.

Figure 2:
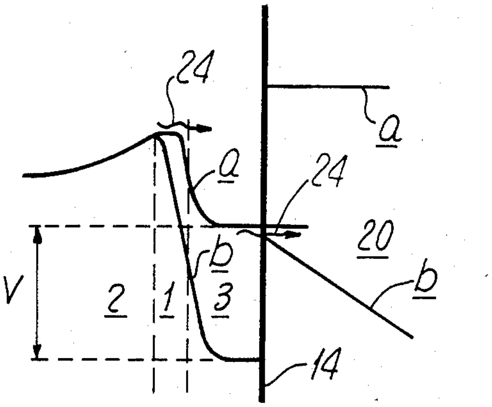
FIG. 2 is an energy diagram through such an electron source, both under bias and zero bias conditions.

Line a in FIG. 2 is the electron energy and potential diagram through the electron source into free space in the thermal equilibrium, zero bias condition. Line b in FIG. 2 is the corresponding diagram with the potential difference V applied between regions 2 and 3, just sufficient to deplete the whole region 1. As can be seen by comparing lines a and b in FIG. 2, this results in the potential of the surface barrier between region 3 and free space 20 being shifted to a lower level (more positive) with respect to the region 2 so that when electron injection occurs in any significant quantity (line b) the energy of the injected electrons 24 has been raised by a corresponding amount. The potential difference V necessary to fully deplete the region 1 may be, for example, about 4 volts, depending on the thickness and doping concentration of the region 1. Increasing the applied bias V above this minimum value reduces the height of the barrier between the regions 2 and 3 and so increases the electron flow into the region 3.

The height of the barrier between the regions 2 and 3 can be chosen so that the electrons 24 injected into the n-type region 3 have just the right energy to traverse the region 3 and to overcome the surface barrier at the area 4. This surface barrier is between 4 and 5 eV in the case of a clean uncoated silicon surface. However, as illustrated in FIG. 1, the surface area 4 may be coated in known manner with a very thin film 14 of a material reducing the work function, for example barium or caesium. In this case the surface barrier is reduced to about 2 eV. Such a caesium coating 14 is incorporated in the particular example of the electron source of FIG. 1 previously described in which the barrier region 1 is depleted by punch-through and has a barrier height of about 4 volts. On applying a potential difference V of about 4 volts to this device, hot electrons 24 are injected across the barrier region 1 and emitted from the surface area 4 into free space 20 with good efficiency.

Instead of a punch-through structure, it is also possible to use a barrier region 1 which is depleted of holes even at zero bias by the merging together of the depletion layers in the region 1 at zero bias. This may be achieved in the FIG. 1 structure by increasing the thickness of the region 1 and increasing the doping concentration of the adjacent region 2. Barrier regions depleted even at zero bias are already known for majority charge-carrier diodes, hot-electron transistors and hot-hole transistors from U.S. Pat. No. 4,149,174. Reference is invited to this patent for information on the conditions to be satisfied in order to maintain the barrier region 1 substantially depleted at zero bias and to obtain a particular barrier height. In a particular example of an electron source in accordance with the present invention a barrier region 1 which is depleted at zero bias and has a barrier height of about 3 volts is obtained by increasing the doping concentration of the n-type epitaxial layer providing the adjacent region 2 to $2\times10^{17}$ phosphorus atoms per $cm^3$, and increasing the thickness of the region 1 to 0.125 micrometers while decreasing the doping concentration of the region 1 to $2.5\times10^{17}$ $cm^{-3}$. Compared with the high quality diodes described in U.S. Pat. No. 4,149,174, this choice of thickness and doping concentrations deliberately degrades the diode ideality factory of the barrier region 1 in order to increase the energy of the electrons 24 injected into the region 3.

Compared with electron sources having punch-through barrier regions 1 as described with reference to FIG. 2, such an electron source having a barrier region 1 depleted at zero bias has the advantage of being substantially depleted of minority carriers (holes) even if the applied voltage V is switched to a very low level (at or near zero volts). However such very low voltage levels are not necessary to switch off an electron source in accordance with the invention, since this may be achieved by reducing the applied voltage to just below the level needed to establish the emission of the electrons 24 which as previously described may be between 3 and 4 volts. Furthermore the increased epitaxial layer doping concentration of such an electron source having a fully-depleted barrier region 1 tends to increase the capacitance of the junction between the regions 1 and 2, and the increased thickness of the region 1 increases the distance between the surface area 4 and the point of emission of the hot electrons 24 at the barrier region. Thus, in these respects it is more advantageous to use a punch-through barrier region 1 rather than a barrier region 1 depleted at zero bias.

Figure 3:
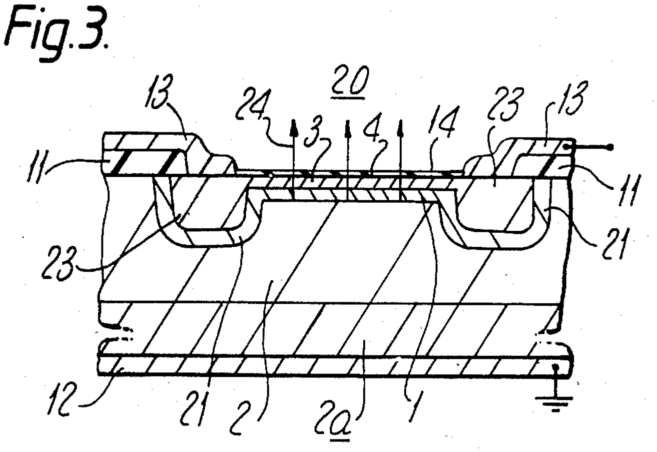
FIG. 3 is a cross-sectional view of part of a semiconductor body of another electron source in accordance with the invention.

The FIG. 1 configuration having a sunken insulating layer 11 and a semiconductor mesa portion 9 permits fabrication of a very simple n-p-n region structure having very low associated capacitances. A less advantageous configuration for an electron source in accordance with the invention is illustrated in FIG. 3, in which the insulating layer 11 is not sunk in the body 10 over the depth of the regions 1 and 3, and the junctions between the regions 2 and 1 and 1 and 3 are brought to the top surface of the body 10 by means of deep annular boundary regions 21 and 23 of p-type and n-type conductivity respectively. Even when the supply of hot electrons 24 emitted from the surface area 4 is established, the p-type region 21 is not depleted of holes across a part of its thickness between the n-type region 23 and the n-type epitaxial layer 2. The n-type region 23 serves as a contact region for the metal electrode 13. The regions 21 and 23 are formed in separate doping steps before implanting the regions 1 and 3.

Figure 4:
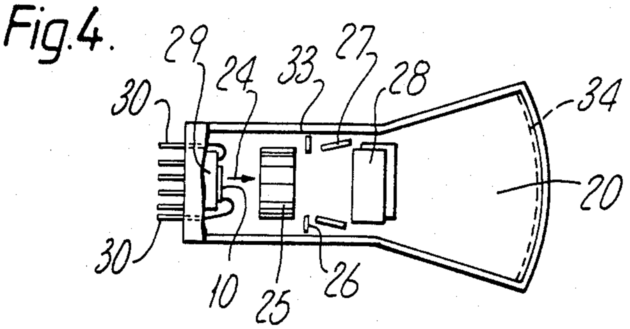
FIG. 4 is a cathode-ray tube in accordance with the invention and including an electron source in accordance with the invention.

The device structures of FIGS. 1, 2 or 3 in accordance with the invention can be incorporated as electron sources in many different forms of equipment having a vacuum envelope. FIG. 4 illustrates one such equipment by way of example, namely a cathode-ray tube. This equipment of FIG. 4 comprises a vacuum tube 33 which is flared and which has an end wall coated with a fluorescent screen 34 on its inside. The tube 33 is hermetically sealed to accommodate a vacuum 20. Included in the tube 33 are focussing electrodes 25,26 and deflection electrodes 27,28. The electron beam 24 is generated in one or more electron sources in accordance with the present invention which are situated in the semiconductor body 10. The body 10 is mounted on a holder 29 within the tube 33, and electrical connections are formed between the metal layers 12,13 and terminal pins 30 which pass through the base of the tube 33. Such electron sources in accordance with the present invention may also be incorporated in, for example, image pick-up devices of the vidicon type. Another possible equipment is a memory tube in which an information-representative charge pattern is recorded on a target by means of a modulated electron flow generated by the electron source of the body 10, which charge pattern is subsequently read by a constant electron beam generated preferably by the same electron source.

Figure 5:
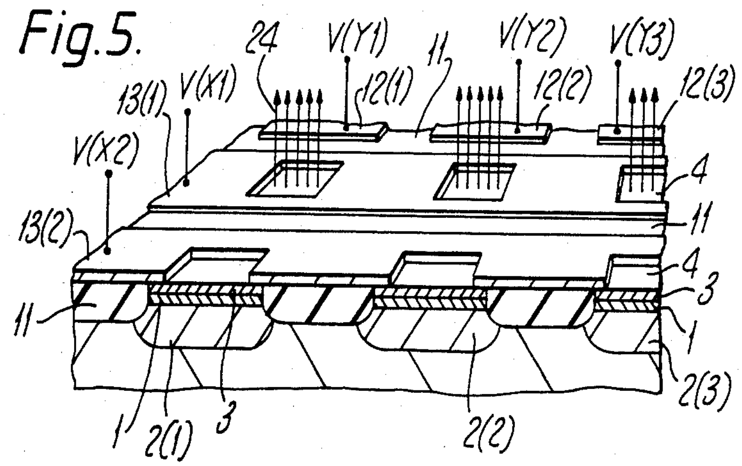
FIG. 5 is a partial cross-sectional and partial perspective view of part of a semiconductor body of a further electron source in accordance with the invention.
Figure 6:
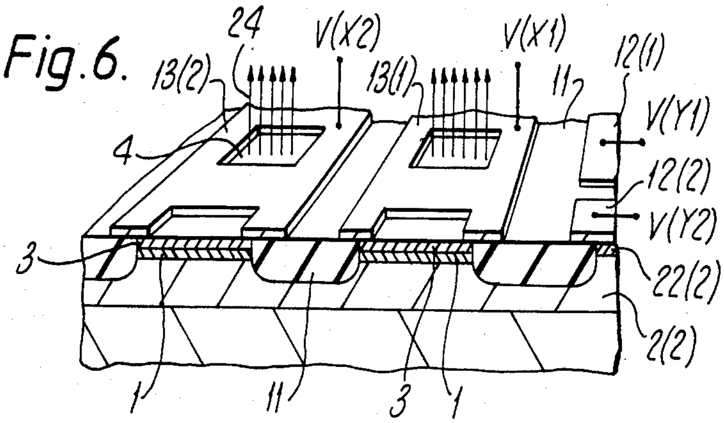
FIG. 6 is a partial cross-sectional and partial perspective view of part of the body of the electron source of FIG. 5, taken perpendicular to the view of FIG. 5.

Known technology used for the manufacture of silicon integrated circuits can be used to fabricate electron sources in accordance with the invention as an array in a common semiconductor body. This is facilitated by the simple n-p-n structure of such sources having only electrode connections to the two n-type regions 3 and 2. FIGS. 5 and 6 illustrate one example of a two-dimensional array of such electron sources each of which can be individually controlled to regulate its own individual electron emission. The body 10 of the device of FIGS. 5 and 6 has at one major surface a two-dimensional array of mesa portions 9 each having an n-p-n electron emitter structure similar to that illustrated in FIG. 1. However the bulk of the body 10 is now lightly-doped p-type material in which the second regions 2 are provided as n-type islands. The individual electron sources are connected together in an X-Y cross-bar system. The n-type regions 3 of mesa portions in each X-direction of the array have a common electrode connection 13(1), 13(2), etc. which extends in the X-direction to contact regions 3 at top surfaces of the mesa portions 9. The n-type islands providing the regions 2 are in the form of stripes 2(1), 2(2), 2(3) etc. which extend in the Y-direction of the array to connect together in a common island the n-type regions 2 of the individual n-p-n electron-sources in each Y-direction. Each of these n-type stripes 2(1), 2(2), 2(3) etc. has an electrode connection 12(1), 12(2), 12(3) etc. which contacts its stripe via a highly-doped contact region, one of which 22(2) is illustrated in FIG. 6. These contact regions can be formed in their own separate mesa portions by the same doping treatment as is used to form the n-type regions 3. These separate contact-region mesa portions are masked against the doping treatment used to form the p-type regions 1. Individual electron sources of the X-Y array can be controlled by selecting the electrode connections 12(1), 12(2) etc. and 13(1), 13(2) etc. to which the operating voltages V(Y) and V(X) are applied to bias the region 3 positive with respect to the region 2 for electron emission. Different magnitudes of bias V(X1), V(X2) . . . , V(Y1), V(Y2) etc. can be applied to different connections so that different electron fluxes 24 can be emitted by different electron sources so generating a desired electron flux pattern from the whole array.

Such a two-dimensional array device is particularly useful as an electron-source in a display device which can have a flatter vacuum tube 33 than that of the cathode-ray tube of FIG. 4. In such a flat device, the picture can be produced on a fluorescent screen 34 at one side of the tube by generating different electron flux patterns from the array in the body 10 mounted at the opposite side of the tube, instead of by deflecting a single electron beam as in a cathode-ray tube.

Such a two-dimensional array is also useful for electron lithography in the manufacture of semiconductor devices, integrated circuits and other microminiature solid-state devices. In this application the array is mounted as the electron source in a chamber of a lithographic exposure apparatus. The chamber is connected to a vacuum pump for generating a vacuum in the chamber for the exposure operation. The body of the solid-state device being manufactured is introduced into the chamber and has on its surface an electron-sensitive resist which is then exposed to an electron flux pattern from the electron source array, for example via an electron lens system. Thereafter the body of the solid-state device is removed from the chamber and processed further in known manner. The use of a semiconductor two-dimensional electron-source array for display devices and for electron lithography is already described in U.K. patent application No. 7902455 published as GB No. 2013398A to which reference is invited.

For the sake of clarity in the drawings, a coating 14 is not shown as included in the structure of FIGS. 5 and 6. However such a coating 14 can be provided at the surface area 4 of each of the n-p-n electron source mesa portions of the device of FIGS. 5 and 6. Although FIGS. 5 and 6 show by way of example substantially square apertures in the electrode connections 13 at the emissive surface areas 4, these apertures may be of another shape, for example circular. Especially in large two-dimensional arrays a highly-conductive n-type buried region (n+) may be present along the bottom of each n-type stripe 2(1), 2(2), 2(3) etc. to reduce series resistance.

Many other modifications are possible within the scope of the present invention. Thus although the n-p-n structure 2-1-3 must have electrode connections only to the n-type second and third regions 2 and 3 (i.e. no electrode connection to the intermediate region 1), the body 10 of an electron source in accordance with the invention may have additional electrodes which are not connected to the n-p-n structure 2-1-3. Thus, an electron source in accordance with the present invention may additionally include an accelerating electrode which is insulated from the semiconductor surface and which extends around the edge of the surface area 4 of the n-type third region 3 from which the hot electrons 24 are emitted. In this case the n-type third region 3 can be contacted by its electrode connection 13 via a deep n-type contact region at an area remote from the surface area 4 from which the hot electrons 24 are emitted. The use of an insulated accelerating electrode for a different type of electron source outside the scope of the present invention is already described in said GB No. 2013398A to which reference is invited. It is also possible for such an additional insulated electrode to be split-up for deflection purposes into two or more separate insulated electrodes around the surface area 4.

Instead of having a monocrystalline silicon body 10, the semiconductor body of an electron source in accordance with the invention may be of other semiconductor material, for example a III-V semiconductor compound, or polycrystalline or hydrogenated amorphous silicon which is deposited on a substrate of glass or other suitable material.

In the embodiments so far described with reference to FIGS. 1, 2, 3, 5 and 6, the n-type third region 3 provides the surface area 4 from which the electrons 24 are emitted into free space. However the n-type third region 3 in an electron source within the scope of the present invention may be separated from the surface area 4 by at least a further region having a p-type doping concentration which introduces a potential peak in the body to form adjacent the surface area 4 an electric field which assists emission of electrons 24 across the boundary of the body 10 at the area 4. Electron sources having such p-type doping concentration electric field regions are described and claimed in co-pending U.S. patent application Ser. No. 439,143 which was filed on the same day as the present application.

We claim:

1. An electron source for emitting a flow of electrons, comprising a semiconductor body, an n-p-n structure formed in the body by a p-type first region between n-type second and third regions, electrons being generated in said n-p-n structure for emission from a surface area of said body after flowing from the second region through the first and third regions, characterized in that the n-p-n structure has electrode connections only to said n-type second and third regions, in that the first region provides a barrier region restricting the flow of electrons from the second region to the third region until a potential difference is applied between said electrode connections to bias the third region positive with respect to the second region and to establish a supply of hot electrons injected into said third region with sufficient energy to overcome the surface barrier at said surface area of the body, said barrier region forming depletion layers with both the n-type second and third regions and having such a thickness and doping concentration as to be depleted of holes by the merging together of said depletion layers in the barrier region at least when said potential difference is applied between said electrode connections to establish said supply of hot electrons.

2. An electron source is claimed in claim 1, further characterized in that said n-type third region has a higher conductivity-type determining doping concentration than that of the p-type first region and that of at least the part of the n-type second region adjacent the first region.

3. An electron source as claimed in claim 1, further characterized in that at least the part of the n-type second region adjacent the first region has a lower conductivity-type determining doping concentration than that of the first region.

4. An electron source as claimed in claim 1, further characterized in that an apertured insulating layer is sunk over at least part of its thickness in said body to form at least one mesa portion of the body bounded laterally by the sunken insulating layer, and in that the first and third regions are formed within said mesa portion and are bounded around their edges by the sunken insulating layer.

5. An electron source as claimed in claim 4, further characterized in that the top surface of the mesa portion provides said surface area from which electrons are emitted, and in that an electrode connection contacts said n-type third region at said top surface of the mesa portion and extends onto said sunken insulating layer.

6. An electron source as claimed in claim 1, further characterized in that said body has at one major surface a two-dimensional array of said n-p-n structures, in that the n-type third regions in one direction of the array have a common electrode connection which extends in said one direction, and in that the n-type second regions in a transverse direction of the array form a common n-type stripe extending in said transverse direction.

7. An electron source as claimed in claim 1, further characterized in that said barrier region is undepleted over a pair of its thickness by the depletion layers formed with the n-type second and third regions at zero bias, the application of a potential difference of at least a predetermined minimum magnitude being necessary between said electrode connections to spread said depletion layers across the whole thickness of said barrier region and so to establish said supply of hot electrons having sufficient energy to overcome the surface barrier at said surface area.

8. An electron source as claimed in claim 1, further characterized in that the thickness and doping concentration of said barrier region are such that the depletion layers formed at zero bias with both said n-type second and third regions merge together in said barrier region.

9. An electron source as claimed in claim 1, wherein said surface area of the body is covered with a material reducing the electron work function.

10. Equipment comprising a vacuum envelope within which a vacuum can be maintained, and an electron source as claimed in claim 1, said electron source being mounted within the envelope for emitting electrons into said vacuum during operation of the equipment.

* * * * *